US009263986B2

(12) United States Patent  
Williams

(10) Patent No.: US 9,263,986 B2  
(45) Date of Patent: Feb. 16, 2016

(54) SOLAR HYBRID PHOTOVOLTAIC-THERMAL COLLECTOR ASSEMBLY

(71) Applicant: Douglas Williams, Northbrook, IL (US)

(72) Inventor: Douglas Williams, Northbrook, IL (US)

(*) Notice: Subject to any disclaimer, the term of this patent is extended or adjusted under 35 U.S.C. 154(b) by 0 days.

(21) Appl. No.: 14/147,129

(22) Filed: Jan. 3, 2014

(65) Prior Publication Data

US 2015/0194557 A1    Jul. 9, 2015

(51) Int. Cl.
*H01L 31/0525* (2014.01)
*H02S 40/44* (2014.01)
*H01L 31/052* (2014.01)
*H02S 40/40* (2014.01)
*H02S 40/42* (2014.01)
*H01L 31/042* (2014.01)
*F24J 2/00* (2014.01)

(52) U.S. Cl.
CPC .......... *H02S 40/44* (2014.12); *H01L 31/0521* (2013.01); *F24J 2/00* (2013.01); *H01L 31/052* (2013.01); *H01L 31/0525* (2013.01); *H02S 20/00* (2013.01); *H02S 40/40* (2014.12); *H02S 40/42* (2014.12); *H02S 40/425* (2014.12)

(58) Field of Classification Search
CPC .............. H01L 31/052; H01L 31/0521; H01L 31/0525; H01L 31/0488; H02S 30/10; H02S 10/10; H02S 20/00; H02S 40/40; H02S 40/42; H02S 40/425; H02S 40/44; F24J 2/00
USPC ........................................................ 136/246
See application file for complete search history.

(56) References Cited

U.S. PATENT DOCUMENTS

| 4,002,031 | A | * | 1/1977 | Bell ........................ F03G 6/001 |
| | | | | 126/698 |
| 5,128,181 | A | * | 7/1992 | Kunert ............................ 428/34 |
| 5,338,369 | A | * | 8/1994 | Rawlings ...................... 136/246 |
| 2002/0189662 | A1 | * | 12/2002 | Lomparski .................... 136/246 |
| 2004/0084077 | A1 | * | 5/2004 | Aylaian ......................... 136/246 |
| 2004/0216778 | A1 | * | 11/2004 | Ferri et al. .................... 136/251 |
| 2008/0032620 | A1 | * | 2/2008 | Chen et al. .................... 454/212 |
| 2008/0302405 | A1 | * | 12/2008 | Intrieri .......................... 136/246 |
| 2009/0019796 | A1 | * | 1/2009 | Liebendorfer ............... 52/173.3 |

(Continued)

OTHER PUBLICATIONS

Building America Solution Center; Boilers can provide Zoned heating with Parallel piping Loops; https://basc.pnnl.gov/images/boilers-can-provide-zoned-heating-parallel-piping-loops; accessed and printed Sep. 16, 2015; pp. 1-2.*

*Primary Examiner* — Allison Bourke
*Assistant Examiner* — Edward Schmiedel

(57) ABSTRACT

A solar collector assembly includes a photovoltaic panel having first and second sides, a frame, and a first gas-filled chamber on the first side of the photovoltaic panel. The first gas-filled chamber is at least partially defined by a portion of the frame and by a portion of the first side of the photovoltaic panel. A gas functions as a heat exchange fluid and collects heat from solar energy and/or heat generated by the photovoltaic panel. The photovoltaic panel accumulates and converts solar energy to electrical energy. The solar collector assembly may include a second gas-filled chamber provided on the second side of the photovoltaic panel. The second gas-filled chamber is at least partially defined by a portion of the frame and by a portion of the second side of the photovoltaic panel. Solar collector systems and methods of generating electrical energy and/or thermal energy are also described.

11 Claims, 15 Drawing Sheets

(56) References Cited

U.S. PATENT DOCUMENTS

2009/0288705 A1* 11/2009 Hiwatashi et al. ............ 136/256
2010/0154864 A1* 6/2010 Oh et al. ...................... 136/248
2011/0253201 A1* 10/2011 Morita et al. ................. 136/251
2012/0174504 A1* 7/2012 Ferrara ........................ 52/173.3
2012/0266936 A1* 10/2012 Weibezahn et al. .......... 136/246

* cited by examiner

SOLAR HYBRID PHOTOVOLTAIC-THERMAL COLLECTOR ASSEMBLY

RELATED APPLICATION

This application claims the priority benefit of U.S. Provisional Application No. 61/789,541, filed Mar. 15, 2013. The entire contents of the provisional application are incorporated herein by reference, except that in the event of any inconsistent disclosure or definition from the present specification, the disclosure or definition herein shall be deemed to prevail.

BACKGROUND OF THE INVENTION

1. Technical Field

The present teachings relate generally to solar energy collection assemblies and, more particularly, to hybrid photovoltaic-thermal collection assemblies.

2. Description of Related Art

Solar hybrid energy collectors, also known as photovoltaic-thermal (PVT) collectors, represent a new and growing field of energy generation. The combination of photovoltaic (PV) and thermal collection in a single unit provides a more efficient collection system than a collector that captures only electrical or only thermal energy. For example, conventional solar hybrid PVT devices may have efficiencies as much as three to four times greater than a typical PV-only system.

In addition, the thermal energy collected by a PVT device—energy that would otherwise have been wasted in a PV-only system—may be used constructively in applications including but not limited to water-heating, space-heating, low-temperature generation of electricity, and/or the like. Moreover, the removal of heat from a PVT device may be advantageous to its operational efficiency since cooler PV cells operate optimally at temperatures of less than or equal to about 25° C. By contrast, in a PV-only system, the build-up of thermal energy from overheated panels reduces efficiency and electrical output of the system.

Notwithstanding the above-described benefits of PVT devices, conventional solar hybrid energy systems remain complex, expensive to manufacture, prone to mechanical failure, and typically require trained and specialized personnel for their installation. One reason is that the use of liquids (e.g., water, halocarbon coolants, etc.) to cover PV cells and act as heat transfer agents in conventional PVT devices creates challenges for both installation and proper device functioning. By way of example, water is subject to freezing in colder climates, and halocarbon coolants (e.g., fluorinated hydrocarbons such as those sold under the trade name FREON by E. I. du Pont de Nemours and Company) may require special handling and recycling facilities.

An example of a hybrid system is disclosed in U.S. Pat. No. 4,700,013 (Soule). In this example, a PV collector absorbs short wavelengths and a thermal collector, which is placed below the PV system, absorbs long wavelengths associated with heat energy.

Another example of a hybrid system is disclosed in U.S. Pat. No. 4,607,132 (Jarnagin) in which PV cells are placed above a chamber containing a heat exchange fluid such as water or Freon.

Another example of a hybrid system is disclosed in U.S. Pat. No. 6,675,580 (Ansley, et al.), which discloses a flexible assembly of PV cells that can be attached to a solar collector below the PV cells.

Another example of a hybrid system is disclosed in U.S. Pat. No. 6,630,622 (Konold). The disclosed device uses a complex system of heat transfer tubes and Fresnel lenses in order to concentrate solar power.

SUMMARY OF THE INVENTION

The scope of the present invention is defined solely by the appended claims, and is not affected to any degree by the statements within this summary.

In one example, a solar collector assembly in accordance with the present teachings includes a photovoltaic panel having a first side and a second side; a frame configured for enclosing at least a portion of the photovoltaic panel along a periphery thereof; and a first gas-filled chamber provided on the first side of the photovoltaic panel. The first gas-filled chamber may be at least partially defined by at least a portion of the frame and by at least a portion of the first side of the photovoltaic panel. A gas may be configured to function as a heat exchange fluid and collect heat from solar energy and/or heat generated by the photovoltaic panel. The photovoltaic panel can accumulate and convert solar energy to electrical energy.

In one example, a solar collector assembly according to the teachings of the present invention further includes a second gas-filled chamber provided on the second side of the photovoltaic panel, wherein the second gas-filled chamber may be at least partially defined by at least a portion of the frame and by at least a portion of the second side of the photovoltaic panel.

In one example according to the teachings of the present invention, a solar collector assembly in accordance with the present teachings further includes a first sealing element configured for coupling with the frame. The first gas-filled chamber may be further defined by at least a portion of the first sealing element. The first sealing element may include a transparent panel.

In one example according to the teachings of the present invention, a solar collector assembly in accordance with the present teachings further includes a second sealing element configured for coupling with the frame, wherein the second gas-filled chamber may be further defined by at least a portion of the second sealing element. The second sealing element may include an insulating panel.

In one example according to the teachings of the present invention, a solar collector assembly in accordance with the present teachings may include a photovoltaic panel having a first side and a second side, a frame configured for enclosing at least a portion of the photovoltaic panel along a periphery thereof, and a first gas-filled chamber provided on the first side of the photovoltaic panel, a first sealing element configured for coupling with the frame, the first gas-filled chamber being further defined by at least a portion of the first sealing element and by at least a portion of the first side of the photovoltaic panel; a second sealing element configured for coupling with the frame. The solar collector assembly may further include a second gas-filled chamber provided on the second side of the photovoltaic panel, the second gas-filled chamber being at least partially defined by at least a portion of the frame, by at least a portion of the second side of the photovoltaic panel, and by at least a portion of the second sealing element. A gas may be configured to function as a heat exchange fluid and accumulate and collect heat from solar energy and/or heat generated by the photovoltaic panel. The photovoltaic panel can accumulate and convert solar energy to electrical energy.

In one example according to the teachings of the present invention, the first sealing element may be a transparent panel, and wherein the second sealing element may be an insulating panel.

In one example according to the teachings of the present invention, the frame may include an upper frame part and a lower frame part. The upper frame part includes the portion of the frame that at least partially defines the first gas-filled chamber, and the lower frame part includes the portion of the frame that at least partially defines the second gas-filled chamber.

In one example according to the teachings of the present invention, the transparent panel and the insulating panel may be positioned on opposite sides of the photovoltaic panel and spaced apart, respectively, from the first side and the second side. The photovoltaic panel can be sealed between the first gas-filled chamber and the second gas-filled chamber.

In one example according to the teachings of the present invention, a solar collector assembly in accordance with the present teachings may include one or a plurality of ambient gas conduits configured for carrying ambient temperature gas into the first gas-filled chamber and/or the second gas-filled chamber and, in some examples, one or a plurality of heated gas conduits configured for carrying heated gas out of the respective gas-filled chamber in which the heated gas was generated. Transportation of the ambient gas and/or the heated gas may be is facilitated by one or a plurality of fans.

In one example according to the teachings of the present invention, a solar collector system in accordance with the present teachings may include a plurality of interconnected solar collector assemblies, and an inverter electronically coupled with the plurality of interconnected solar collector assemblies and configured to receive electrical energy therefrom. Each of the plurality of interconnected solar collector assemblies may include a photovoltaic panel having a first side and a second side, a frame configured for enclosing at least a portion of the photovoltaic panel along a periphery thereof, and a first gas-filled chamber provided on the first side of the photovoltaic panel. The first gas-filled chamber may be at least partially defined by at least a portion of the frame and by at least a portion of the first side of the photovoltaic panel, and a gas may be configured to function as a heat exchange fluid and collect heat from solar energy and/or heat generated by the photovoltaic panel.

In one example according to the teachings of the present invention, each of the plurality of interconnected solar collector assemblies may further include a first sealing element configured for coupling with the frame, the first gas-filled chamber being further defined by at least a portion of the first sealing element, a second sealing element configured for coupling with the frame, and a second gas-filled chamber may be provided on the second side of the photovoltaic panel, the second gas-filled chamber being at least partially defined by at least a portion of the frame, by at least a portion of the second side of the photovoltaic panel, and by at least a portion of the second sealing element.

In one example according to the teachings of the present invention, the solar collector assemblies are interconnected to one another at least via gas conduits.

In one example according to the teachings of the present invention, a method of generating electrical energy and/or thermal energy may include exposing a solar collector assembly to solar energy, the solar collector assembly including a photovoltaic panel having a first side and a second side, a frame configured for enclosing at least a portion of the photovoltaic panel along a periphery thereof, and a first gas-filled chamber provided on the first side of the photovoltaic panel. The first gas-filled chamber may be at least partially defined by at least a portion of the frame and by at least a portion of the first side of the photovoltaic panel. A gas may be configured to function as a heat exchange fluid and collect heat from the solar energy and/or heat generated by the photovoltaic panel.

In one example according to the teachings of the present invention, the solar collector assembly may further include a first sealing element configured for coupling with the frame, wherein the first gas-filled chamber is further defined by at least a portion of the first sealing element, a second sealing element configured for coupling with the frame, and a second gas-filled chamber provided on the second side of the photovoltaic panel. The second gas-filled chamber may be at least partially defined by at least a portion of the frame, by at least a portion of the second side of the photovoltaic panel, and by at least a portion of the second sealing element.

In one example according to the teachings of the present invention, a method of generating electrical energy and/or thermal energy in accordance with the present teachings includes exposing a solar collector assembly of a type described above to solar energy. The method can further include providing electrical energy generated by the photovoltaic panel to an inverter and/or a battery.

In one example according to the teachings of the present invention, the method further includes conveying thermal energy generated in the first gas-filled chamber and/or in the second gas-filled chamber to a destination selected from the group consisting of a heat exchanger, a heat storage device, an interior space (e.g., a dwelling, a living space, a storage facility, a vehicle interior, etc.), a low temperature electrical energy generation device, and combinations thereof.

BRIEF DESCRIPTION OF THE DRAWINGS

Objects, features, and advantages of the present invention will become apparent upon reading the following description in conjunction with the drawing figures, in which.

DETAILED DESCRIPTION OF THE DISCLOSURE

Solar hybrid photovoltaic-thermal (PVT) collectors configured to generate electrical energy from solar energy with associated collection of thermal energy, and to use gas as a heat exchange fluid for transportation of the thermal energy, have been discovered and are described herein. The solar hybrid PVT collectors may be configured to incorporate standard, commercially available photovoltaic (PV) panels.

In one example, a solar collector assembly in accordance with the present teachings includes (a) a photovoltaic panel having a first side and a second side; (b) a frame configured for enclosing at least a portion of the photovoltaic panel along a periphery thereof; and (c) a first gas-filled chamber provided on the first side of the photovoltaic panel. The first gas-filled chamber is at least partially defined by at least a portion of the frame and by at least a portion of the first side of the photovoltaic panel. Gases such as air (comprised of mostly nitrogen and oxygen), helium, argon, or various mixtures of these or other gasses may be configured as a heat exchange fluid and to collect heat from solar energy and/or heat generated by the photovoltaic panel.

Representative embodiments in accordance with the present teachings will now be described in reference to the appended drawings. It is to be understood that elements and features of the various representative embodiments described below may be combined in different ways to produce new embodiments that likewise fall within the scope of the present invention. Furthermore, designations such as "top"/"bottom," "upper"/"lower," and the like used herein to describe various elements (e.g., the first gas-filled chamber, second gas-filled chamber, first side of PV panel, second side of PV panel, etc.) are used solely for purposes of illustration and are not intended in any absolute or limiting physical sense (e.g., with respect to the cardinal directions). The drawings and the description below have been provided solely by way of illustration, and are not intended to limit the scope of the appended claims or their equivalents.

As used herein, the term "coupled" and various forms thereof are intended broadly to encompass both direct and indirect coupling. Thus, a first part is said to be coupled to a second part when the two parts are directly coupled (e.g. by direct contact or direct functional engagement), as well as when the first part is functionally engaged with an intermediate part which is in turn functionally engaged either directly or via one or more additional intermediate parts with the second part. Also, two parts are said to be coupled when they are functionally engaged (directly or indirectly) at some times and not functionally engaged at other times.

Figure 1:
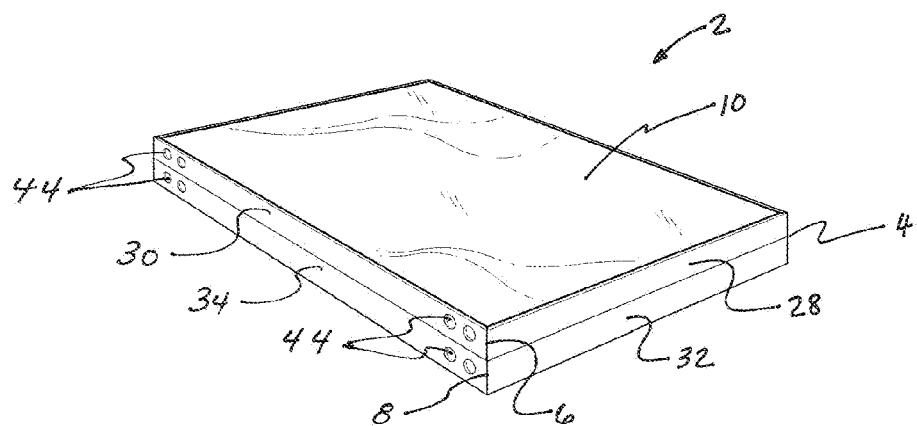
FIG. 1 shows a top perspective view of one example of a fully assembled solar hybrid PVT collector in accordance with the present teachings.
Figure 7:
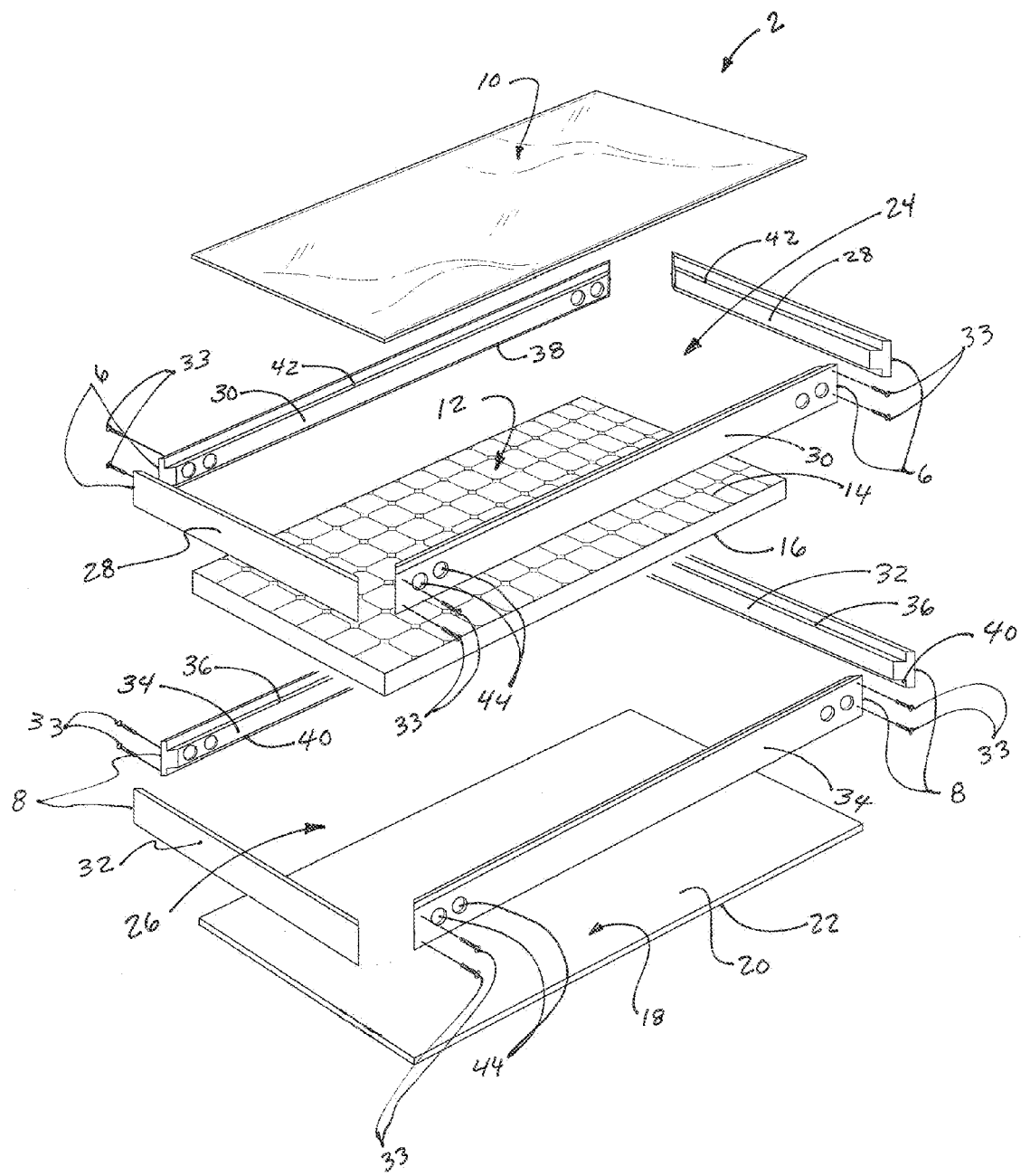
FIG. 7 shows an exploded top perspective view of the representative solar hybrid PVT collector of FIG. 1.

Turning now to the drawings, FIG. 1 shows a fully assembled solar hybrid collector 2 in accordance with the present teachings. As best shown by FIG. 7, the solar hybrid collector 2 includes an enclosing frame 4 with an upper frame part 6 and a lower frame part 8. The upper frame part 6 and the lower frame part 8 together retain a top glazing 10, a PV panel 12, and a bottom-insulating panel 18.

Figure 3:
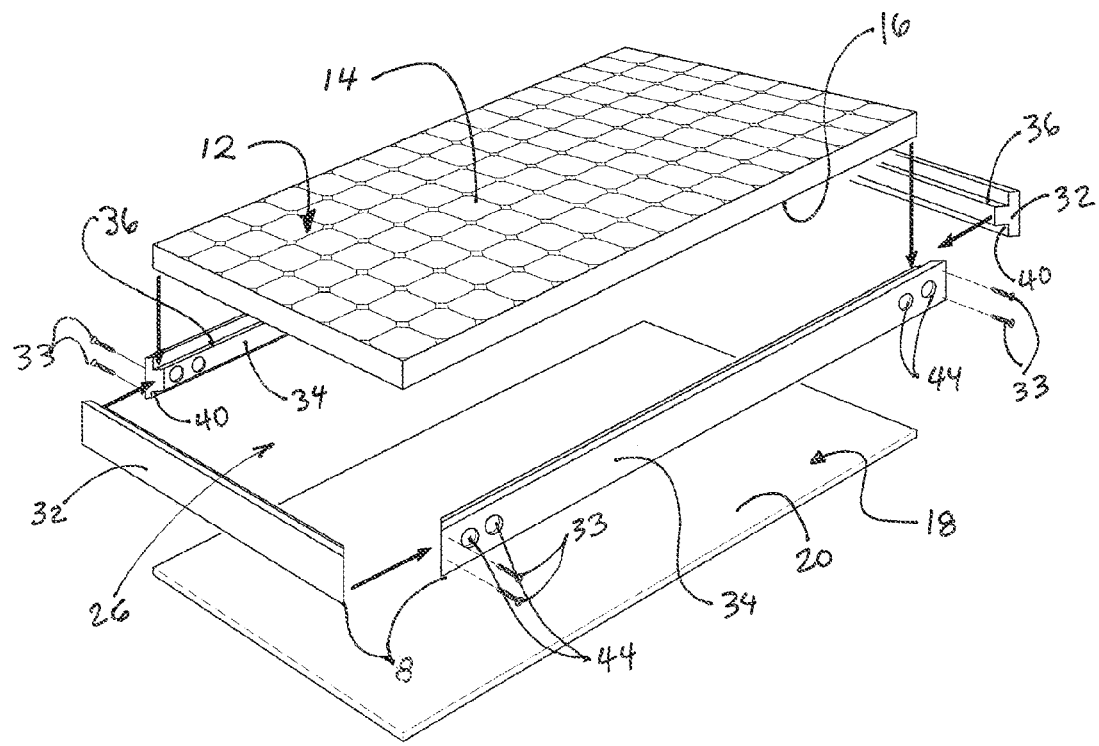
FIG. 3 shows an exploded top perspective view of the unassembled lower enclosing frame of FIG. 2 together with a PV panel and a bottom-insulating panel.

As shown by FIG. 7, the upper frame part 6 and the lower frame part 8, together with the glazing 10, the PV panel 12, and insulating panel 18, form a top gas-filled chamber 24 and a bottom gas-filled chamber 26. As shown in FIG. 3, the lower frame part 8 uses the insulating panel 18 to seal the bottom chamber 26. As shown in FIG. 7, the upper frame part 6 uses the glazing 10 (e.g., a glass panel) to seal the top chamber 24 and to provide transparency to the fitted PV panel 12 contained within, the PV panel having a top side 14 and a bottom side 16. As shown in FIG. 3, the lower gas-filled chamber 26 is formed between the spaced apart PV panel 12 and the bottom-insulating panel 18. As shown in FIG. 7, the upper gas-filled chamber 24 is formed between the spaced apart glazing 10 and the PV panel 12.

As shown by FIGS. 1, 6, 8, 9a, 10-12, the upper frame part 6 and lower frame part 8 can adjoin and fasten together securely in a stacked arrangement. The upper frame part 6 and lower frame part 8 may be identical or mirror images of one another and may snap together or involve other attachment mechanisms. In one example in accordance with the present invention, sandwiching a PV panel (e.g., PV panel 12) between two nearly identical enclosures (e.g., top chamber 24 and bottom chamber 26) provides a straightforward, cost-effective design suitable for usage by both commercial and DIY installers.

As FIGS. 2-5 and 7 show, the upper frame part 6 has end sections 28 and side sections 30 that may be joined to form a completed frame via screws 33 or other suitable means. The lower frame part 8 has end sections 32 and side sections 34 that may be similarly joined. The upper frame part 6 and the lower frame part 8 may be joined to one another by a snap fit or other mechanical mechanism including but not limited to screw, brackets, nails, adhesives, and the like, and/or combinations thereof. As shown in FIG. 7, the top gas-filled chamber 24 and bottom gas-filled chamber 26 formed by the enclosing upper frame part 6 and lower frame part 8 may be identical or substantially identical to each other in size and/or form. In one example, the bottom side 16 of the PV panel 12 may be covered and, in another example, the top side 14 of the PV panel 12 may be covered. As shown in FIG. 7, the top side 14 of the PV panel 12 is covered with the glazing 10 to define the upper chamber 24.

Figure 2:
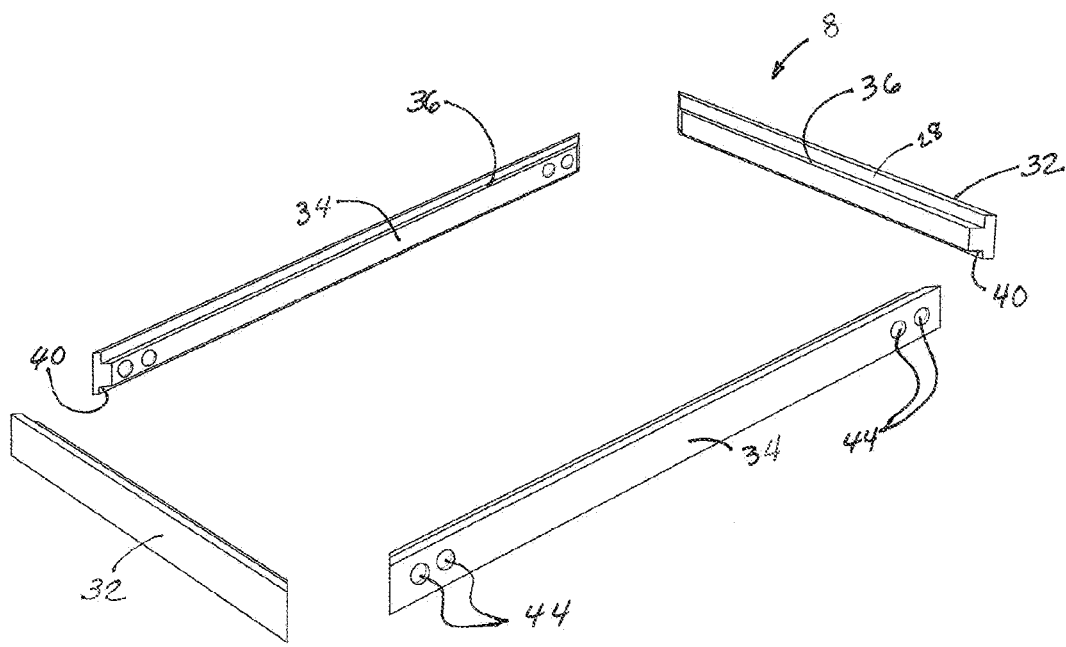
FIG. 2 shows an exploded top perspective view of one example of an unassembled lower enclosing frame for use with the representative solar hybrid PVT collector of FIG. 1.

FIG. 2 shows the lower enclosing frame part 8 of the PVT collector 2 in an unassembled state without the PV panel 12 or the bottom-insulating panel 18. FIG. 3 shows a similar view of the lower enclosing frame part 8 in the unassembled state but including the PV panel 12 and bottom-insulating panel 18. The lower frame part 8 includes a bottom-insulating panel 18 to seal the bottom enclosure 26.

Figure 4:
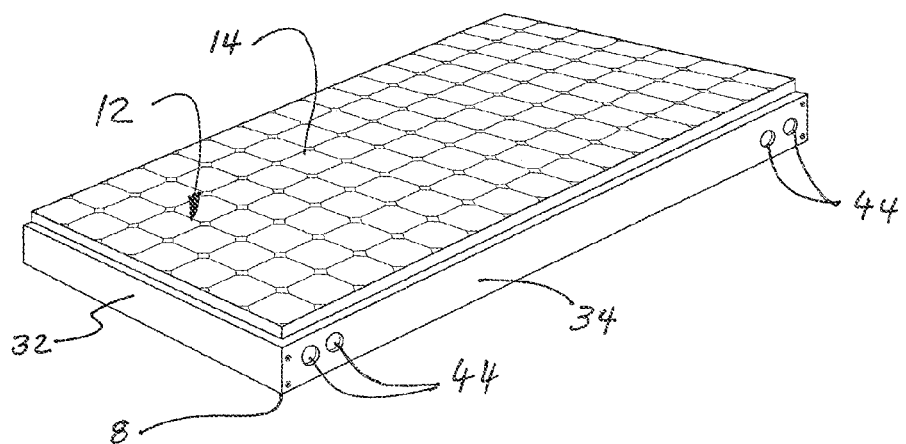
FIG. 4 shows a top perspective view of the lower enclosing frame, the PV panel, and the bottom-insulating panel of FIG. 3 assembled for use with the representative solar hybrid PVT collector of FIG. 1.
Figure 5:
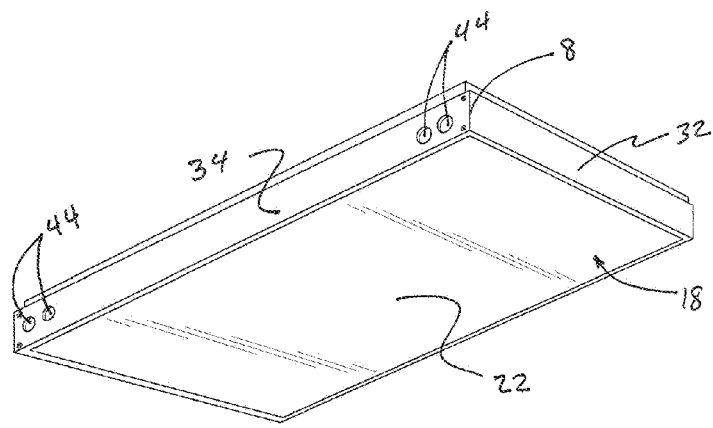
FIG. 5 shows a bottom perspective view of the assembled lower enclosing frame, PV panel, and bottom-insulating panel of FIG. 4.

FIG. 4 shows a top view of the assembled lower enclosing frame part 8 including the PV panel 12 and the bottom-insulating panel 18 (not shown). The lower frame part 8 may be configured to fit around and hold the bottom side 16 of the photovoltaic panel 12 in a position spaced from the bottom-insulating panel 18, and to provide a sealable fit around the bottom-insulating panel 18 enclosing the second thermal chamber 26. FIG. 5 shows a bottom view of the assembled lower enclosing frame part 8 including the PV panel 12 and the bottom-insulating panel 18 having a bottom surface 22.

In the example shown in FIG. 3, the lower frame part 8 is configured to hold about half of the thickness or depth of the PV panel 12. As further shown in FIG. 3, each of the lower frame parts 8 may have a ledge 36 so that, when assembled, the PV panel 12 may rest on the ledge 36 in the lower frame parts 8. This creates a space for the bottom gas chamber 26 between a bottom side 16 of the PV panel 12 and a top side 20 of the bottom-insulating panel 18. The lower frame part 8 may have a groove 40 into which the bottom-insulating panel 18 may be fitted. With the lower frame part 8 fully assembled on all sides of the bottom-insulating panel 18, the bottom-insulating panel 18 is configured to be retained in the grooves 40. Alternatively, the lower frame part 8 may be formed without a groove 40 or a spacing ledge 36. The PV panel 12 and/or bottom-insulating panel 18 may then be sealed to the lower frame part 8 with an adhesive, silicone, and/or other suitable material.

Figure 6:
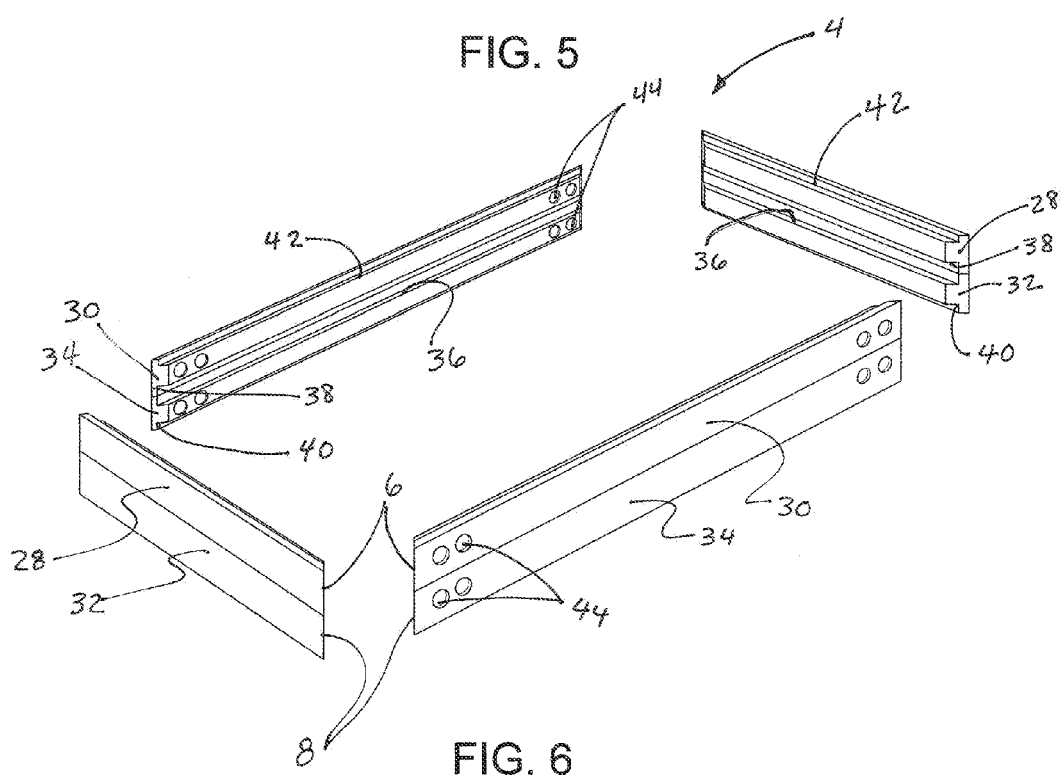
FIG. 6 shows an exploded top perspective view of one example of unassembled sections of upper and lower enclosing frames for use with the representative solar hybrid PVT collector of FIG. 1.

FIG. 6 shows the unassembled upper enclosing frame part 6 and lower enclosing frame part 8 of the photovoltaic-thermal collector of FIG. 1 without the top glazing 10, PV panel 12, or bottom-insulating panel 18. The upper frame part 6 is designed to fit and enclose the top side 14 of the PV panel 12, and to provide a secure and sealable fit for glass or other transparent glazing 10 spaced apart from the PV panel 12 and enclosing the first thermal chamber 24. As further shown in FIG. 6, each of the upper frame parts 8 may have a ledge 38 so that, when assembled, the PV panel 12 may rest on the ledge 38 in the upper frame parts 6. Each of the upper frame parts 6 may have a groove 42 into which the glazing 10 may be fitted. With the upper frame part 6 fully assembled on all sides of the glazing 10, the glazing 10 is configured to be retained in the groove 42. The upper frame parts 6 may be formed without a groove 42 or a spacing ledge 38, so that the glazing 10 and/or the PV panel 12 may be sealed to the upper frame part 6 with an adhesive, silicone, and/or other suitable material.

In one example as shown in FIGS. 6 and 7, the upper enclosing frame part 6 and the lower enclosing frame part 8 are mirror images of one another. Alternatively, the upper enclosing frame part 6 and the lower enclosing frame part 8 may be integrally-formed with one another, such that the frame 4 may be constituted by four monolithic parts analogous in appearance to the configuration shown in FIG. 6 (e.g., two side sections, each of which includes an upper frame part and a lower frame part, and two end sections, each of which likewise includes an upper frame part and a lower frame part).

In another example according to the teachings of the present invention, different combinations of integrally-formed side sections and end sections are contemplated. In addition to the upper enclosing frame part 6 and the lower enclosing frame part 8 being integrally-formed with one another as described above, each of the two side sections and the two end sections containing these integrally-formed upper enclosing frame part 6 and lower enclosing frame part 8 may themselves be integrally formed as well, such that the entire frame 4 may be constituted by a single monolithic part that includes an upper frame part and a lower frame part along its perimeter.

In addition to the upper enclosing frame part 6 and the lower enclosing frame part 8 being integrally-formed with one another, one of the two side sections and one of the two end sections containing the integrally-formed upper enclosing frame part 6 and lower enclosing frame part 8 may also be integrally formed, such that the frame 4 may be constituted by two monolithic parts, each of which includes an upper frame part and a lower frame part and each of which incorporates one end section and one side section. In additional examples, still other combinations are contemplated (e.g., a monolithic part that includes an integrally-formed upper frame part and a lower frame part as well as an integrally-formed combination of one side section and two end sections; a monolithic part that includes an integrally-formed upper frame part and a lower frame part as well as an integrally-formed combination of one end section and two side sections; etc.).

Figure 8:
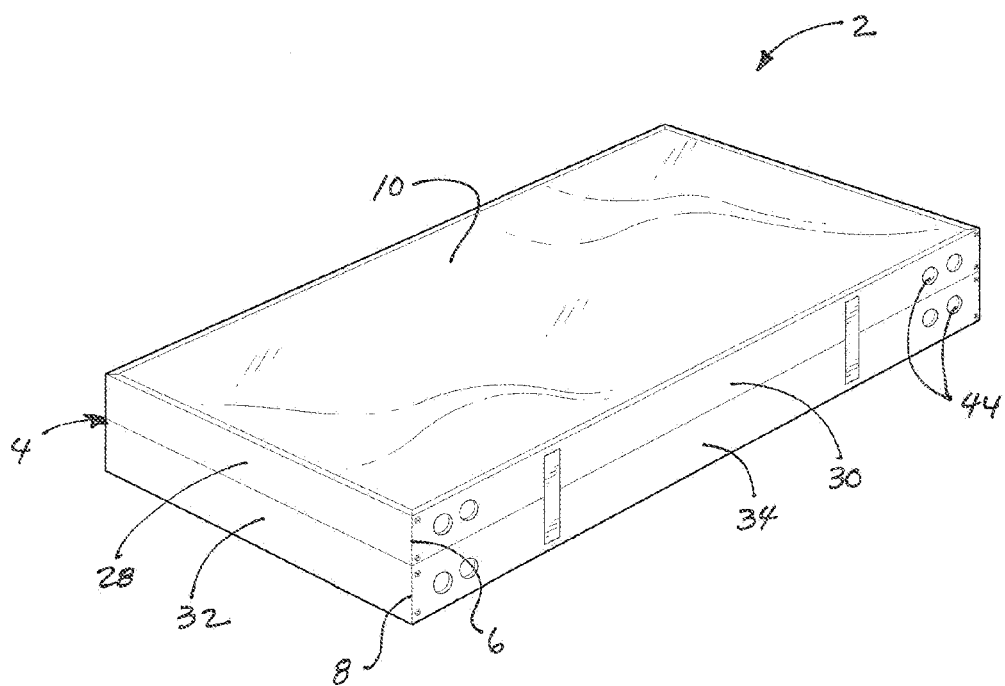
FIG. 8 shows a top perspective view of the assembled representative solar hybrid collector of FIG. 7 in which the end sections and side sections of the upper and lower frame parts have been joined.

As shown in FIG. 6, adding upper frame parts 6 brings the enclosing frame 4 to a full depth of the solar hybrid collector 2. FIG. 7 shows the unassembled upper enclosing frame part 6 and lower enclosing frame part 8 including the top glazing 10, PV panel 12, and bottom-insulating panel 18. FIG. 8 shows the solar hybrid collector 2 with the assembled upper enclosing frame part 6 and lower enclosing frame part 8 including the top glazing 10, the PV panel 12, and with the bottom-insulating panel 18 enclosed. The upper frame part 6 and lower frame part 8 enclose the full depth of the PV panel 12 along with the upper thermal gas chamber 24.

Figure 13:
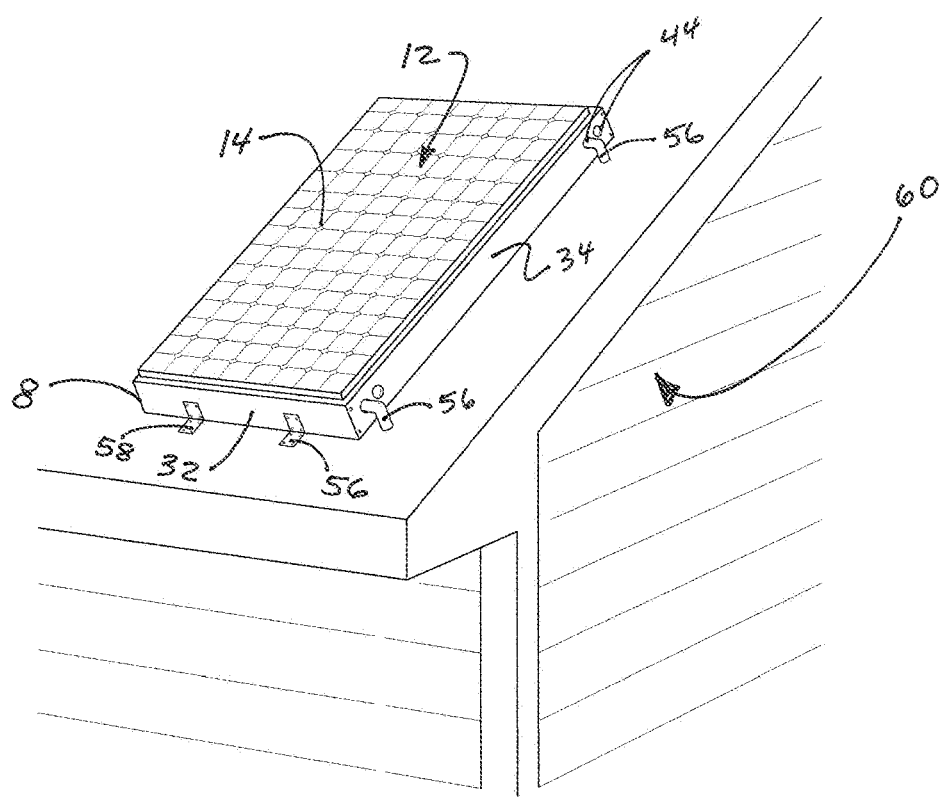
FIG. 13 shows one example of a representative rooftop-mounted solar hybrid collector including only a bottom or single gas-filled chamber in accordance with the present teachings.

In one example in accordance with the teachings of the present invention, an upper frame part 6 or a lower frame part 8 may be used to provide only one enclosed thermal chamber 24 or 26 instead of two. FIGS. 13 and 13a show examples of solar hybrid collectors in accordance with the present teachings that contain only one thermal chamber, which is provided, respectively, on either the bottom side 16 of PV panel 12 or on the top side 14 of the PV panel 12. As shown in FIG. 13, the top side 14 of a pre-assembled PV panel 12 is already glazed and weather-protected, so using only a lower frame part 8 and leaving the PV panel 12 exposed would be a feasible configuration as shown in FIGS. 4, 5, and 13.

Figure 14:
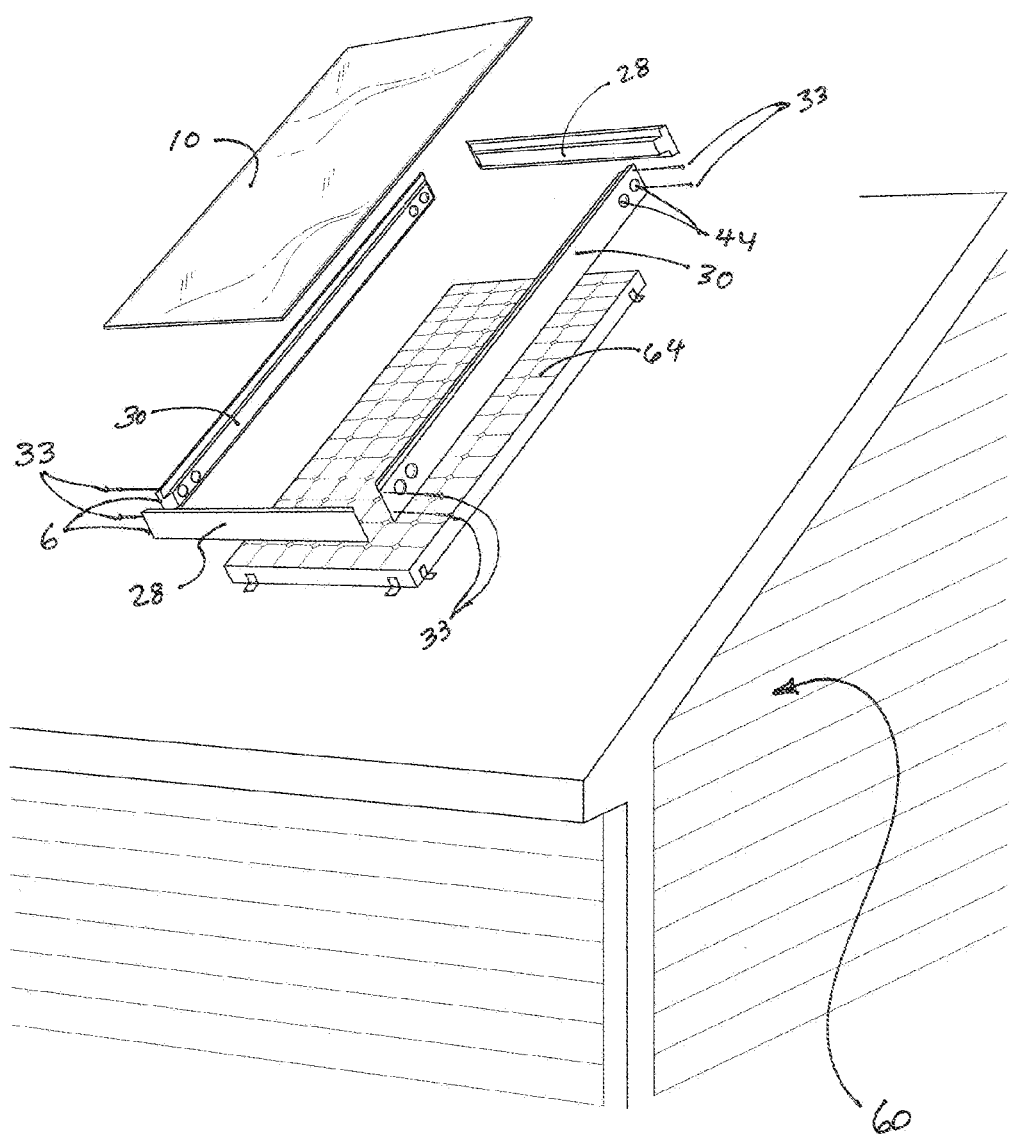
FIG. 14 shows an exploded view of a representative configuration for a top gas-filled chamber only over a photovoltaic panel mounted to a rooftop.
Figure 14A:
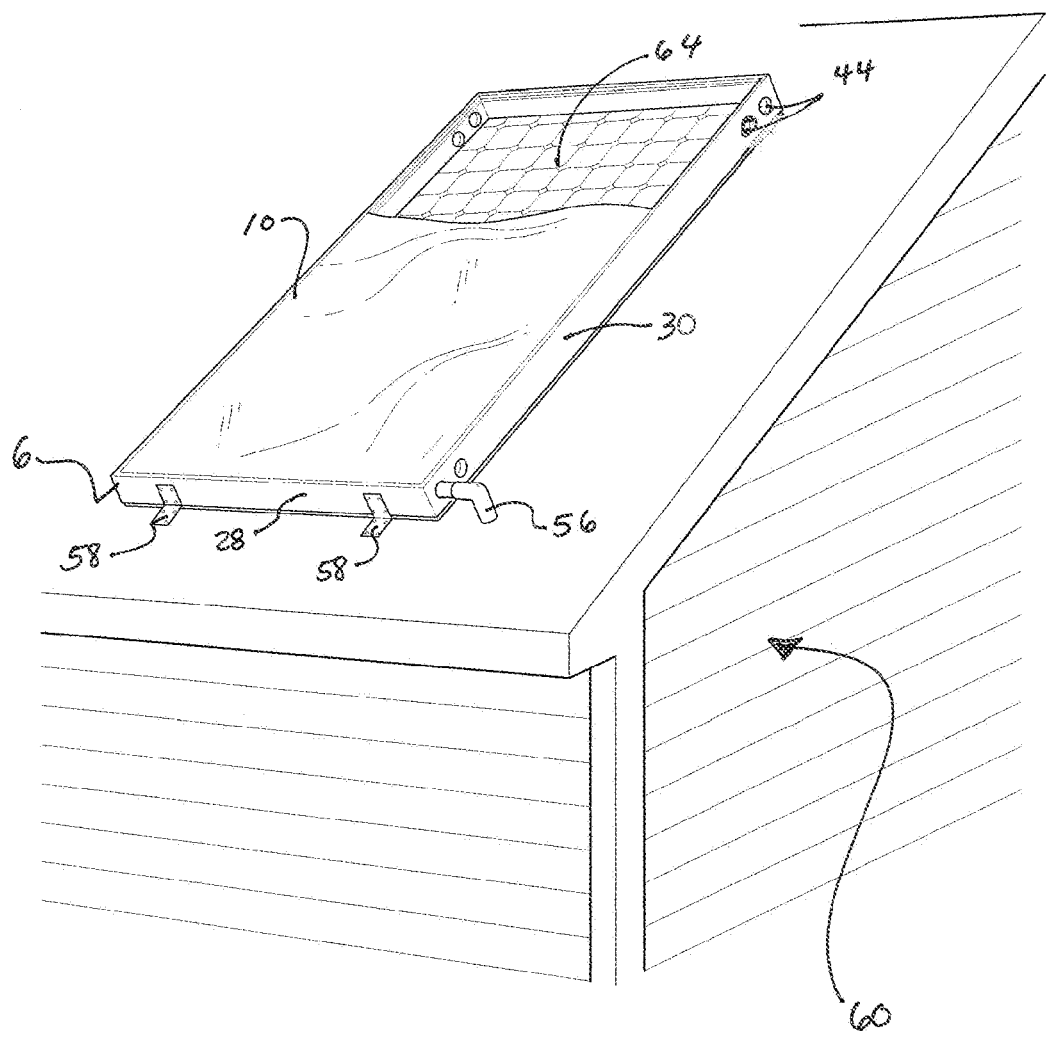
FIG. 14a shows a partial cutaway view of the solar hybrid collector of example of FIG. 14
Figure 14B:
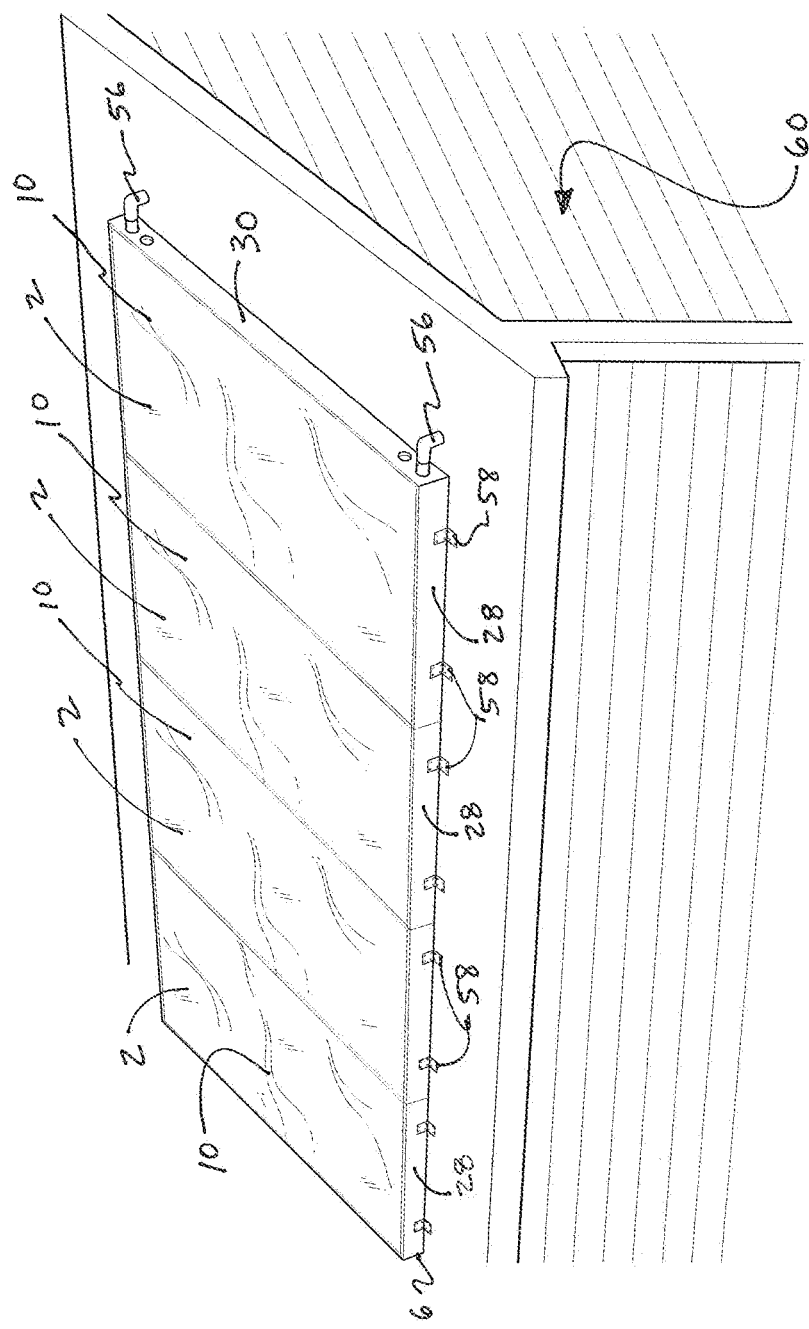
FIG. 14b shows one example of a representative configuration for a rooftop-mounted array of solar hybrid collectors having a top gas-filled chamber only in accordance with the present teachings.

In an example shown in FIGS. 14 and 14a, a top gas-filled chamber is shown assembled to enclose an existing PV panel 64 in order to retrofit such a PV panel for the additional collection of thermal energy. FIGS. 14 and 14a shows such a retrofitted solar hybrid collector assembly with the assembled upper enclosing frame part 6 including the top glazing 10 enclosing and existing PV panel. The example of FIG. 14a shows that the existing PV panel 64 is merely enclosed by a top gas-filled chamber assembly and does not require removal from a rooftop. As shown in FIG. 14b, such a retrofit assembly may be installed over an array of existing PV panels.

In an example in accordance with the teachings of the present invention, a gas is used as a heat exchange fluid. As stated above, gases such as air (comprised of mostly nitrogen and oxygen), helium, argon, or various mixtures of these or other gasses may be configured as a heat exchange fluid and to collect heat from solar energy and/or heat generated by the photovoltaic panel.

Air is extremely low-cost, and allows solar hybrid collectors in accordance with the present teachings to work in an assortment of climates, including but not limited to cold-temperature climates. Helium is about six times more efficient than air for thermal transfer. Helium is also relatively inexpensive. Other gases mentioned may present additional advantages. Other fluids (e.g., water) may leak and/or change state, thereby damaging and/or causing malfunction in a device. Two thermal gas chambers—top gas-filled chamber 24 and bottom gas-filled chamber 26—are shown in FIG. 8. In the example shown in FIG. 7, the top gas-filled chamber 24 is between the glazing 10 and the PV panel 12, and the bottom gas-filled chamber 26 is between the PV panel 12 and the bottom-insulating panel 18.

In one example in accordance with the teachings of the present invention, the upper frame part 6 and lower frame part 8 are adjoined in a stacked arrangement as shown, for example in FIGS. 1, 6, 8, 9a, 10, and 11, to facilitate thermal extraction by attached piping 56 to convey a heat exchange fluid. As shown in FIGS. 1-8, 9a, 10-13, and 13a, round punch out ports 44 may be provided as desired for gas or electrical connections in each customized installation. Alternatively, connections and electrical couplings between ganged or interconnected panels may also be made using the punch out ports where two sections join together. Other ports or openings may be made and used (e.g., for electrical connection or the like), including but not limited to semi-circular ports provided in the upper frame part 6 and/or in the lower frame part 8.

Figure 10:
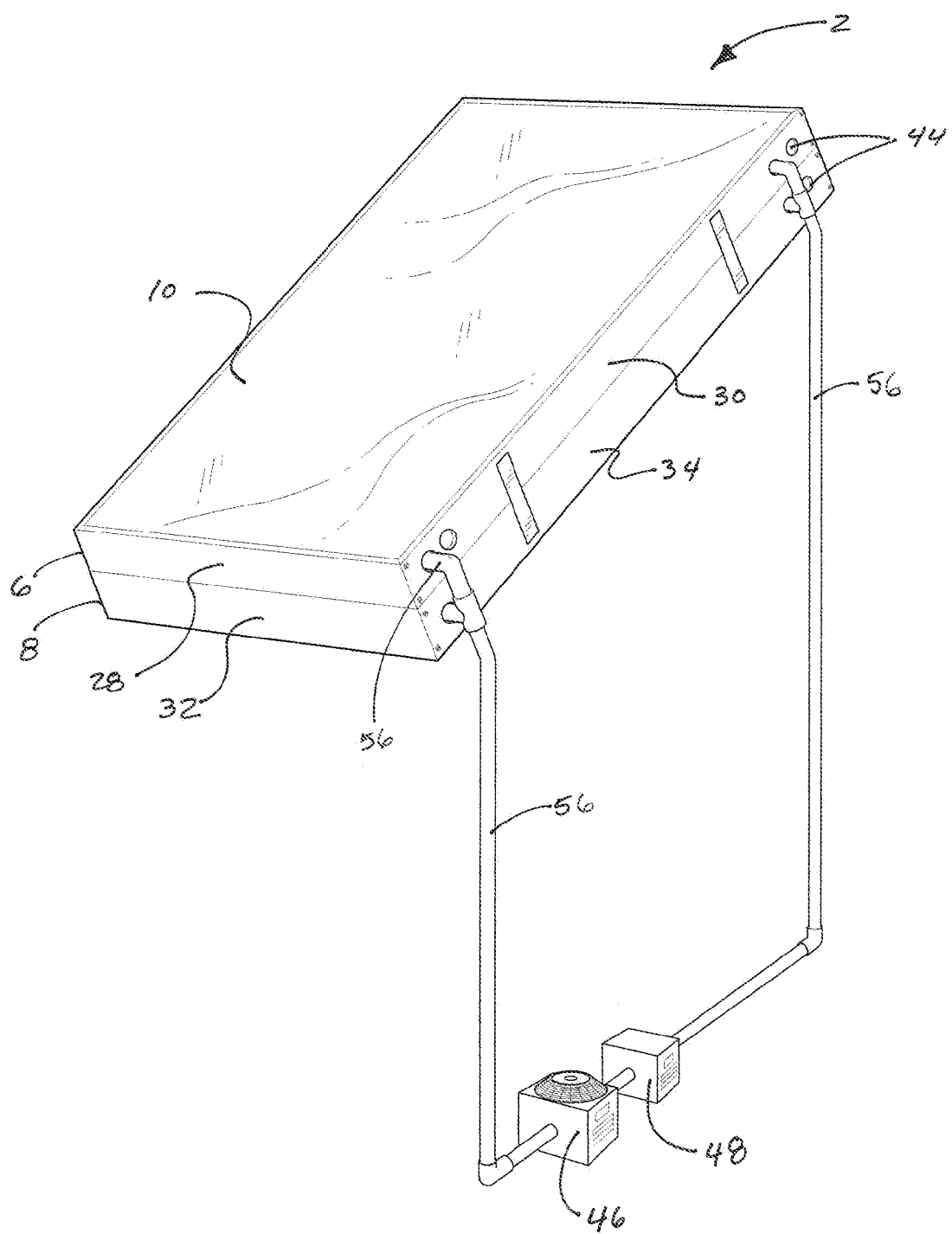
FIG. 10 shows one example of a representative configuration for connecting a solar hybrid PVT collector in accordance with the present teachings to a fan, a heat exchanger, and a controller/monitor system.
Figure 10A:
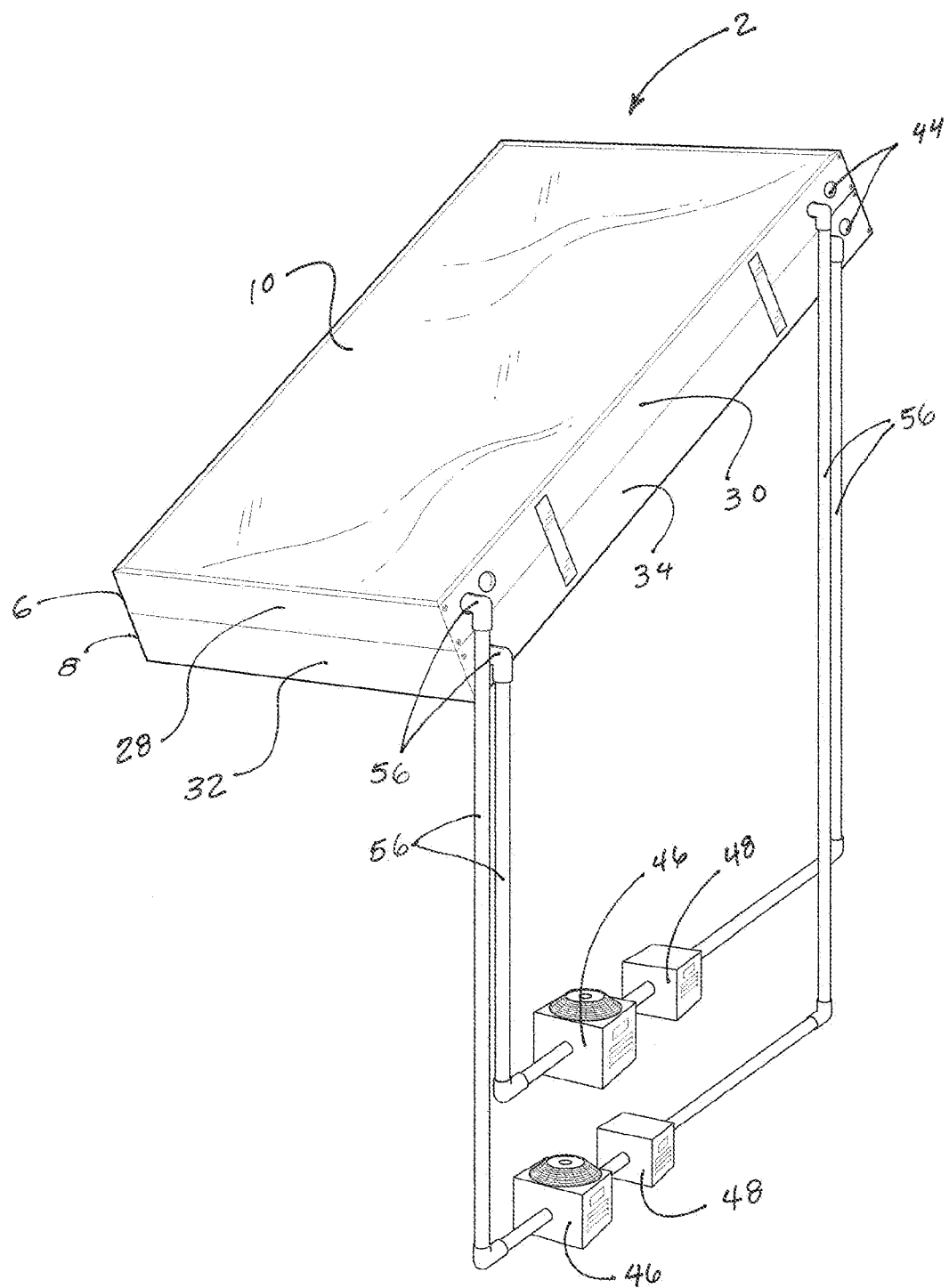
FIG. 10a shows one example of a representative configuration for connecting a solar hybrid PVT collector in accordance with the present teachings to dual fans, dual heat exchangers, and controller/monitor systems.
Figure 11:
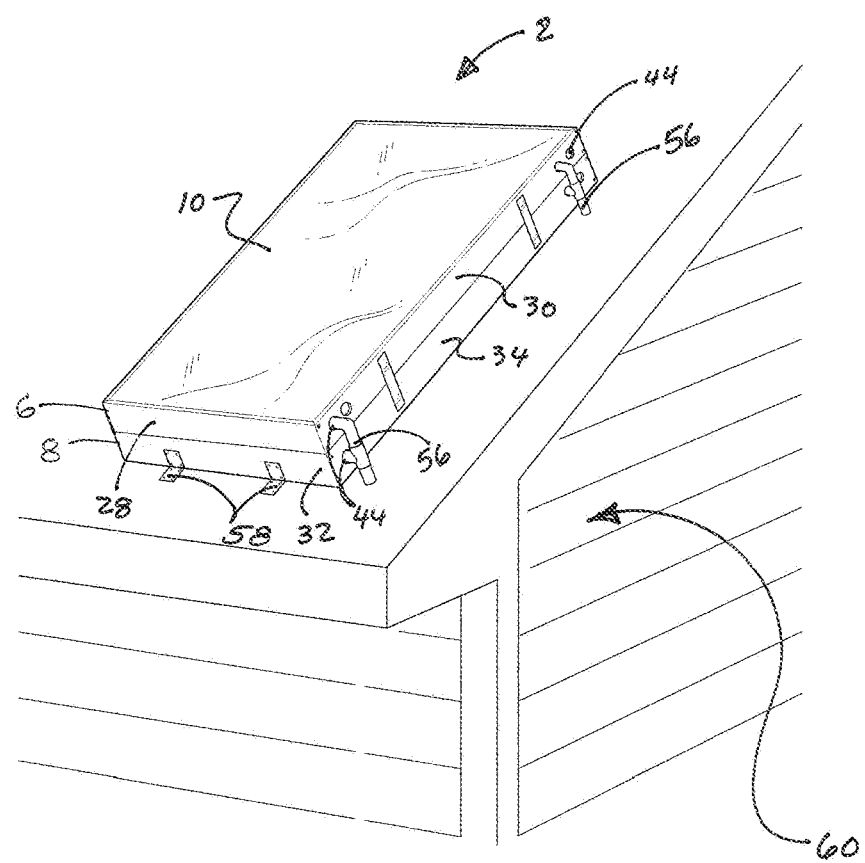
FIG. 11 shows one example of a representative configuration for mounting a single solar hybrid collector in accordance with the present teachings to a rooftop.

In one example in accordance with the present teachings in which a gas is used as the heat exchange fluid, the upper gas chamber 24 and lower gas chamber 26 are separate from one another. Gas or fluid flow requirements may be different on the top and bottom of the PV panel 12 (e.g., for the upper gas chamber 24 and lower gas chambers 26). As shown in FIGS. 10 and 10a, conduits or piping 56 may be used to carry ambient temperature gas to one or more fans 46 and heated gas from a respective upper gas chamber 24 or lower gas chamber 26, either above or below the PV panel 12. The gas may be carried to an external heat exchanger 48 and/or heat storage device, as shown in FIGS. 10 and 10a, or a low temperature electrical energy generation device; or may be circulated directly into an interior space like a dwelling or storage facility 60, as shown in FIG. 11. Such a system may have a controller/monitor for adjusting and balancing a flow of gas within the system. The configuration of the conduits may vary according to each installation situation. In addition, the circulation of gas may be in an open or closed loop system.

In the example shown in FIGS. 10 and 10a, a gas at an ambient temperature may be forced over and under the PV panel 12 through each of the upper gas chamber 24 and lower gas chamber 26 by the external fan 46 or a blower and warmed. As further shown in FIGS. 10 and 10a, piping 56 may be attached to opposite ends of each of the thermal gas chambers 24 and 26, both above and below the PV panel 12 via the punch-out ports 44 per a desired set up arrangement. In the example of FIG. 10A, conduits or piping 56, which may connect to the header pipes 54, may be used to carry ambient temperature gas to one or more fans 46 and heated gas from a respective upper or lower gas chambers and includes double pipe ventilation.

In FIGS. 1-8 and 9a-14b, punch-out ports 44 are shown on the side sections 30 of the upper frame parts 6 and on the side sections 34 of the lower frame parts 8. However, in other examples, such ports may be positioned at other locations (e.g., on a custom basis).

In one example in accordance with the teachings of the present invention, a variable or single-speed fan may be employed with a thermostat to maintain optimal operating temperatures within the enclosures. The flow of gas may also be reversible in order to melt snow or frost that may seasonally accumulate on the exterior of solar hybrid collectors in accordance with the present teachings.

Figure 9:
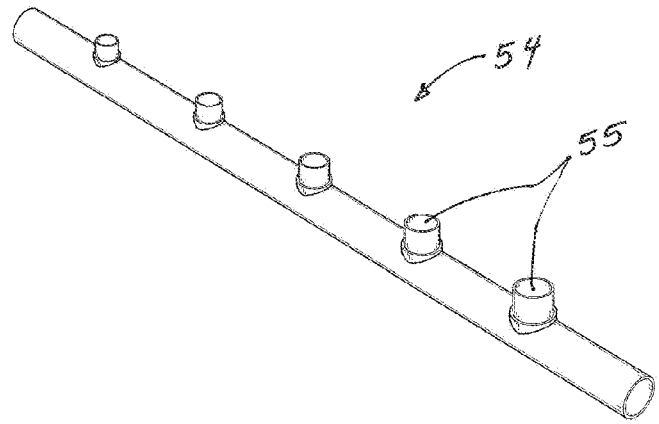
FIG. 9 shows a representative header pipe for use with a representative solar hybrid collector in accordance with the present teachings.
Figure 9A:
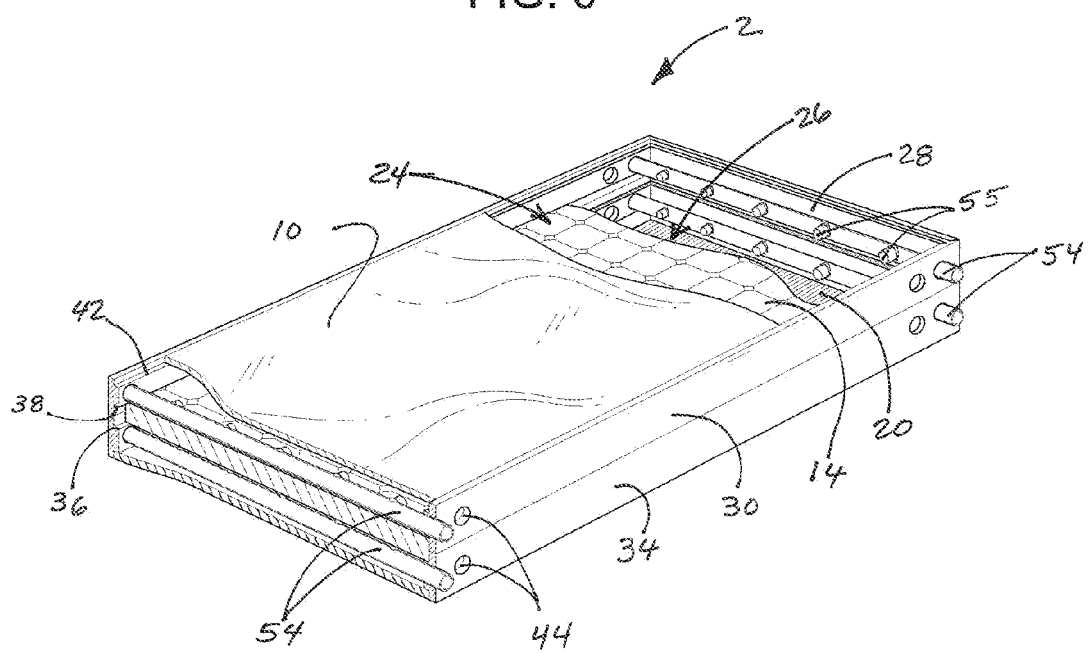
FIG. 9a shows a partial cut-away view of a representative configuration for connecting header pipes to end sections of a solar hybrid PVT collector in accordance with the present teachings.
Figure 12:
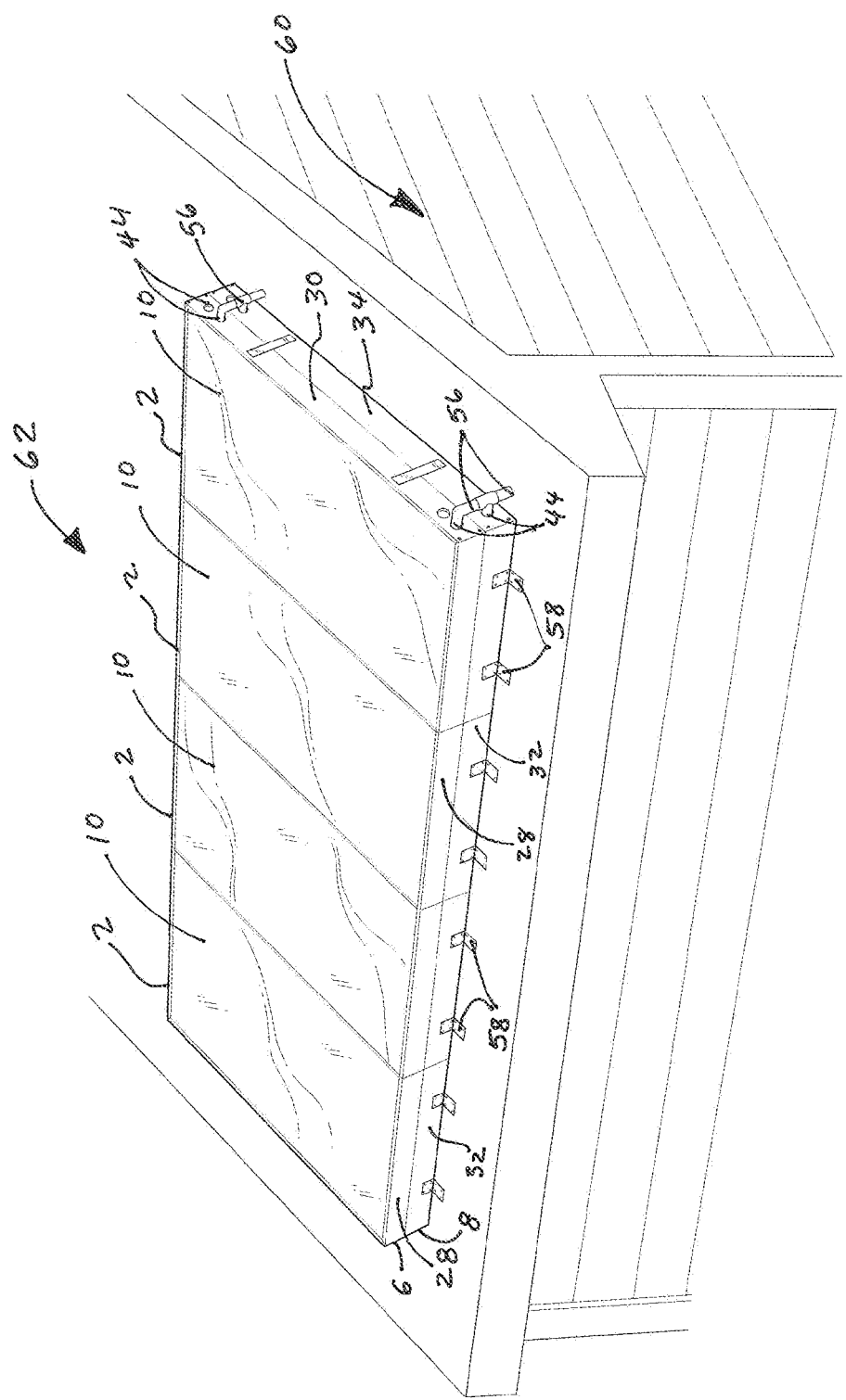
FIG. 12 shows one example of a representative configuration for mounting an array of solar hybrid collectors in accordance with the present teachings to a rooftop.

FIG. 9 shows an example of a header pipe 54 that may be used with a solar hybrid collector in accordance with the present teachings. The length, material, locations of ports, and general configuration of any piping, including header pipes, may vary according to individual installations. Header pipes 54 within the enclosure may be used to ensure equitable distribution of flow of the gas or heat exchange fluid within an individual solar hybrid collector 2 via openings 55, as shown in FIG. 9a, and in an array of adjoined solar hybrid collectors 2, as shown in FIG. 12. Gas may be configured to flow from the bottom gas chamber 26 to the top gas chamber 24 through piping 56 connected to at least one set of the punch out ports 44 on the section ends 28 and 32 to take advantage of heat convection. Flow rates may be determined by the size of the individual collector 2 or array 62 of collectors. In one example, for an array of 4 to 8 collectors of a typical size of 65 inches×40 inches×2 inches, less than about 100 cfm (e.g., about the capacity of a standard bathroom ventilation fan) may be used.

As FIG. 12 shows, an array of solar hybrid collectors may be mounted to a rooftop or other location. Such an array can be interconnected with one another and an AC/DC converter (e.g., an inverter) electronically coupled with the plurality of interconnected solar collector assemblies and configured to receive electrical energy therefrom.

Figure 15:
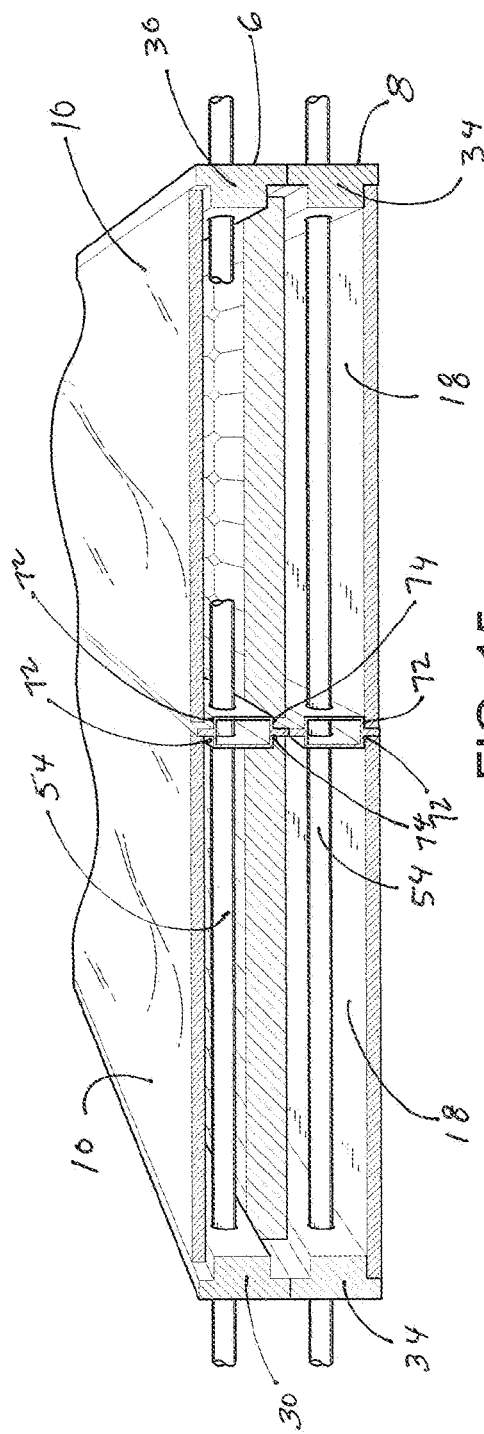
FIG. 15 shows a cut-away view of a representative configuration for a solar hybrid collector with an inner middle frame segment between two adjacent solar hybrid collectors in accordance with the present teachings.
Figure 15A:
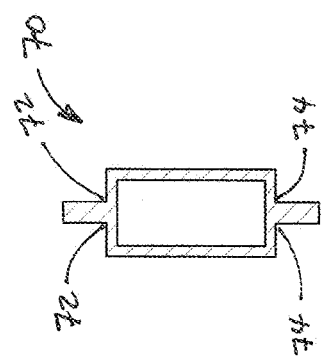
FIG. 15a shows a cross sectional view of a detail of an inner middle frame segment of FIG. 15.

In another example, a number of solar hybrid collectors may be arranged in an array 62 of adjoined solar hybrid collectors similar to the example shown in FIG. 12. In such an array, an upper frame part and a lower frame part, an inner middle frame segment 70, for example, can serve two adjoined solar hybrid collectors as shown in the cross section of FIG. 15. The cross section of FIG. 15a shows that the inner middle frame segment 70 can have two adjacent grooves 72 and two adjacent spacing ledges 74. Two inner middle frame segments 70 that form mirror images can be used together to support, on opposite sides, two adjacent glazing panels, two adjacent PV arrays, and two adjacent insulating panels as shown in FIG. 15. This example of an alternate frame portion can save space between adjoining solar hybrid collectors when such collectors are installed in multiple arrays. Further, the inner middle segment may have punch out ports between two adjacent gas chambers of the two adjoined solar hybrid collectors.

Pre-assembled PV panels are commonly available in a variety of sizes and capacities in home improvement stores and/or online suppliers. In one example in accordance with the teachings of the present invention, such readily available PV panels may be utilized to generate electrical energy. By themselves, these panels do not collect thermal energy and, typically, lose electrical efficiency at operating temperatures above about 30° C. Such temperature levels are easily reached and exceeded in both warm and cooler climates for up to 9 or more months of the year. In addition, increased operating temperatures are liable to degrade PV panel performance over time and shorten PV panel life expectancy. Embodiments in accordance with the present teachings may resolve these operating issues of PV stand-alone panels by acting as a cooling system that re-directs and collects the thermal energy from both sides of the panel. This may improve the electrical component and add a significant thermal component to the overall efficiency of the collector.

In one example according to the teachings of the present invention, pre-assembled PV panels may be fitted into an enclosure optimized for heat extraction, packaging, and/or transportation, thereby capitalizing on the growing availability of pre-assembled PV-only panels that are available from retail home improvement stores and other suppliers in a variety of sizes. Solar collector assemblies in accordance with the present teachings may be economical to manufacture in a variety of sizes and may be assembled in arrays (e.g., systems containing a plurality of PV panels) to increase output. Solar collector assemblies, either individually or in arrays, may be easily installed by untrained or do-it-yourself (DIY) personnel.

The enclosing frame 4 may be made from all manner of functionally suitable and/or economically desirable materials, including but not limited to extruded plastic or aluminum, milled wood, formed composite wood product, and the like, and combinations thereof. In one example in accordance with the teachings of the present invention, the frame material is capable of functioning over a relatively wide range of temperatures and, in some examples, up to and above about 85° C. Representative polymers for use in accordance with the present teachings include but are not limited to polymethylpentene (PMP), with its high heat capacity, polypropylene (PP), polycarbonate (PC), and/or the like, and combinations thereof. The enclosing frames may also have insulating properties. The frame parts may be formed of materials with insulating properties, have coatings with insulating properties, and/or be made to provide insulating properties by other mechanisms in order to reduce thermal losses.

In order for the enclosing frame 4 to form the gas or airtight chamber 26 with the bottom-insulating panel 18, and the gas or airtight chamber 24 with the top glazing 10, the enclosing upper frame part 6 and lower frame part 8 should "seal," respectively, with the top glazing 10 and the bottom-insulating panel 18. Making these seals as gas or airtight as possible may help to avoid infiltration and possible condensation build-up. Thus, in some examples, sealing agents including but not limited to neoprene gaskets, silicone gaskets, and the like, and combinations thereof, may be used to seal the glazing panels 10 and/or insulating panels 18 to form gas-tight bottom gas chambers 26 and top gas chambers 24.

The enclosing frames may be manufactured in stock sizes, or cut and assembled in the field to fit a variety of increasingly standard-sized pre-assembled PV panels. For example, panels configured to generate 235-250 electrical watts are about 65 inches×40 inches×2 inches, panels configured to generate 130 watts are about 59 inches×26 inches×2 inches, and panels configured to generate 100 watts are about 48 inches×22 inches×2 inches.

As shown in FIGS. 11, 12, 13, and 13a, simple metal straps, L-brackets 58, or the like may be used to install the solar hybrid collector 2 and/or the solar hybrid arrays 62 on rooftops or other installation locations. Other methods of installation or attachment may also be used.

The foregoing detailed description and the accompanying drawings have been provided by way of explanation and illustration, and are not intended to limit the scope of the appended claims. Many variations in the presently described embodiments illustrated herein will be apparent to one of ordinary skill in the art, and remain within the scope of the appended claims and their equivalents.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding claim—whether independent or dependent—and that such new combinations are to be understood as forming a part of the present specification.

The invention claimed is:

1. A solar collector assembly comprising:
a photovoltaic panel having a front side and a back side;
a first gas-filled chamber provided on and defined by the front side of the photovoltaic panel;
a second gas-filled chamber provided on and defined by the back side of the photovoltaic panel;
a frame comprising four sidewalls, the four sidewalls enclosing the photovoltaic panel, the first gas-filled chamber, and the second gas-filled chamber each along a periphery thereof;
wherein the first gas-filled chamber and the second gas-filled chamber each contain only gas;
at least one gas conduit comprising an inlet and an outlet, the inlet directly connected to the first gas-filled chamber, the second gas-filled chamber, and a combination of at least one fan and a destination selected from the group consisting of a heat exchanger, a controller, a heat storage device, an interior space, a low temperature electrical generation device, and combinations thereof, and the outlet directly connected to the first gas-filled chamber, the second gas-filled chamber, and the combination of the at least one fan and the destination;
wherein the gas of the first gas-filled chamber and the second gas-filled chamber is configured to function as a heat exchange fluid and to accumulate and collect heat from solar energy and heat generated by the photovoltaic panel, and
wherein the photovoltaic panel converts solar energy to electrical energy.

2. The solar collector assembly of claim 1 further comprising a first sealing element coupled with the frame, wherein the first gas-filled chamber is further defined by the first sealing element spaced from the front side of the photovoltaic panel.

3. The solar collector assembly of claim 2 wherein the first sealing element comprises a transparent panel.

4. The solar collector assembly of claim 1 further comprising a second sealing element coupled with the frame, wherein the second gas-filled chamber is further defined by the second sealing element spaced from the back side of the photovoltaic panel.

5. The solar collector assembly of claim 4 wherein the second sealing element comprises an insulating panel.

6. The solar collector assembly of claim 1 wherein the frame comprises an upper frame part and a lower frame part.

7. The solar collector assembly of claim 6, wherein the upper frame part comprises a portion of the frame that defines the first gas-filled chamber along the periphery thereof, and wherein the lower frame part comprises a portion of the frame that defines the second gas-filled chamber along the periphery thereof.

8. The solar collector assembly of claim 5, wherein the transparent panel is positioned on and spaced apart from the front side of the photovoltaic panel, and the insulating panel is positioned on and spaced apart from the back side of the photovoltaic panel.

9. The solar collector assembly of claim 1 wherein the photovoltaic panel is sealed between the first gas-filled chamber and the second gas-filled chamber.

10. The solar collector assembly of claim 1, wherein
the inlet comprises an ambient temperature gas conduit configured for carrying an ambient temperature gas into the first gas-filled chamber and the second gas-filled chamber; and
the outlet comprises a heated gas conduit configured for carrying a heated gas out of the first gas-filled chamber and the second gas-filled chamber in which the heated gas was generated; and
wherein the carrying of the ambient temperature gas and the heated gas is facilitated by the at least one fan.

11. The solar collector assembly of claim 1 wherein the first gas-filled chamber and the second gas-filled chamber are separated by and defined by the front side and the back side of the photovoltaic panel, respectively.

* * * * *